United States Patent
Maruyama et al.

(10) Patent No.: US 7,153,705 B2
(45) Date of Patent: Dec. 26, 2006

(54) ELECTRONIC DEVICE WITH ELECTRODE AND ITS MANUFACTURE

(75) Inventors: Kenji Maruyama, Kawasaki (JP); Masao Kondo, Kawasaki (JP); Masaki Kurasawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 45 days.

(21) Appl. No.: 10/821,841

(22) Filed: Apr. 12, 2004

(65) Prior Publication Data

US 2004/0195605 A1    Oct. 7, 2004

Related U.S. Application Data

(62) Division of application No. 10/076,349, filed on Feb. 19, 2002, now Pat. No. 6,744,085.

(30) Foreign Application Priority Data

Oct. 26, 2001    (JP)    .............................. 2001-329688

(51) Int. Cl.
*H01L 21/00*    (2006.01)

(52) U.S. Cl. ........................................................ 438/3

(58) Field of Classification Search ............ 438/3, 438/240, 758, 761, 778
See application file for complete search history.

(56) References Cited

U.S. PATENT DOCUMENTS

| | | | |
|---|---|---|---|
| 5,192,723 A | 3/1993 | Fujiu et al. | |
| 5,491,102 A * | 2/1996 | Desu et al. | 438/3 |
| 5,514,484 A | 5/1996 | Nashimoto | |
| 5,623,439 A | 4/1997 | Gotoh et al. | |
| 5,995,359 A | 11/1999 | Klee et al. | |
| 6,117,689 A * | 9/2000 | Summerfelt | 438/3 |
| 6,194,753 B1 | 2/2001 | Seon et al. | |
| 6,258,459 B1 | 7/2001 | Noguchi et al. | |
| 6,432,793 B1 * | 8/2002 | Reinberg | 438/396 |
| 6,815,219 B1 * | 11/2004 | Kim | 438/3 |
| 2001/0005026 A1 | 6/2001 | Nakamura | |

FOREIGN PATENT DOCUMENTS

| | | |
|---|---|---|
| EP | 0 957 516 A1 | 3/1997 |
| EP | 0795 898 A2 | 3/1997 |
| JP | 07-153643 | 6/1995 |
| JP | 09-008243 | 1/1997 |
| JP | 10-189887 | 7/1998 |

OTHER PUBLICATIONS

P.C. Van Buskirk et al., "Common and Unique Aspects of Perovskite Thin Film CVD Processes" Integrated Ferroelectrics, vol. 21, pp. 273-289, (1998).

* cited by examiner

*Primary Examiner*—Scott B. Geyer
(74) *Attorney, Agent, or Firm*—Arent Fox PLLC

(57) ABSTRACT

A method of manufacturing an electronic device includes the steps of: (a) preparing a (001) oriented $ReO_3$ layer; and (b) forming a (001) oriented oxide ferroelectric layer having a perovskite structure on the $ReO_3$ layer. Preferably, the step (a) includes the steps of: (a-1) preparing a (001) oriented MgO layer; and (a-2) forming a (001) oriented $ReO_3$ layer on the MgO layer. An electronic device capable of obtaining a ferroelectric layer of a large polarization and a method of manufacturing the same are provided.

7 Claims, 3 Drawing Sheets

FIG.2A  Mg(DPM)₂
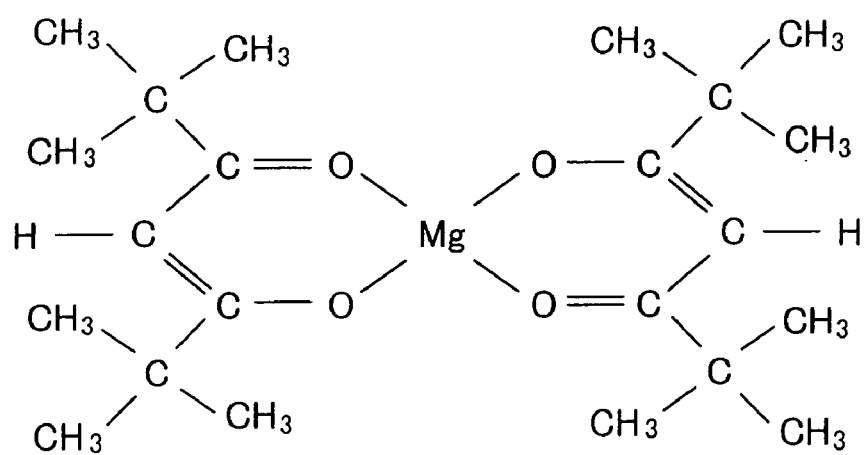
FIG.2B  i-PrO
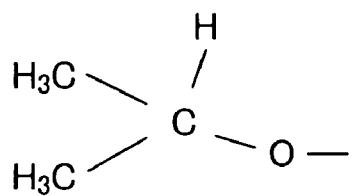

ELECTRONIC DEVICE WITH ELECTRODE AND ITS MANUFACTURE

CROSS REFERENCE TO RELATED APPLICATION

This is a divisional application which claims the benefit of pending U.S. patent application Ser. No. 10/076,349 now U.S. Pat. No. 6,744,085, filed Feb. 19, 2002. The disclosure of the prior application is hereby incorporated herein in its entirety by reference.

This invention is based on and claims priority of Japanese patent application 2001-329688, filed on Oct. 26, 2001, the whole contents of which are incorporated herein by reference.

BACKGROUND OF THE INVENTION

1. Field of the Invention

The present invention relates to an electronic device having a ferroelectric layer and a method of manufacturing the same, more particularly to an electronic device having a ferroelectric layer oriented crystallographically and a method of manufacturing the same.

2. Description of the Related Art

A semiconductor memory, in which one memory cell is constituted of one transistor and one capacitor, has been widely known. A capacitor of a dynamic random access memory (DRAM) has a capacitor dielectric layer formed of a paraelectric material. Electric charges stored in the capacitor gradually decrease therefrom due to their leak even when the transistor is turned off. Accordingly, when a voltage applied to the memory cell is removed, information stored therein decreases and disappears before long.

A memory capable of retaining information stored therein even after power is cut off is called a non-volatile memory. As a kind of the non-volatile memory, a one-transistor/one-capacitor type memory, a capacitor dielectric layer of which is formed of a ferroelectric material, has been known, which is called a ferroelectric random access memory (FeRAM).

The FeRAM utilizes residual polarization of the ferroelectric material as information stored therein. The FeRAM controls a polarity of a voltage applied between a pair of electrodes of the ferroelectric capacitor, thus controlling the direction of the residual polarization. Assuming that one polarization direction be "1" and the other be "0", binary information can be stored. Since the residual polarization remains in the ferroelectric capacitor even after the applied voltage is removed therefrom, the non-volatile memory can be realized. In the non-volatile memory, information can be rewritten by a sufficient number of times, that is, $10^{10}$ to $10^{12}$ times. The non-volatile memory also has a rewriting speed of an order of several ten nanoseconds and offers a high-speed operability.

As ferroelectric materials, lead-based oxide ferroelectric materials having a perovskite structure and bismuth-based oxide ferroelectric materials having a bismuth-layered structure have been known. Typical examples of the lead-based ferroelectric materials are $PbZr_xTi_{1-x}O_3$ (PZT), $Pb_yLa_{1-y}Zr_xTi_{1-x}O_3$ (PLZT) and the like. A typical example of the bismuth-based oxide ferroelectric materials is $SrBi_2Ta_2O_9$ (BST).

The ferroelectric capacitor offers a higher charge retention capability as the polarization of the ferroelectric material is greater, and can retain the electric potential with less capacitance. Specifically, the FeRAM can be fabricated with high integration. Furthermore, as the polarization of the ferroelectric material is greater, the polarization directions can be differentiated more clearly even at a low reading-out voltage, thus enabling the ferroelectric memory to be driven at a low voltage.

It is effective to arrange orientations of ferroelectric crystals uniformly in order to increase a polarization amount of the ferroelectric material. For example, on pages 382 to 388 of "Journal of Applied Physics" 1991, vol. 70, No. 1, disclosed is a technology of obtaining a (111)-oriented ferroelectric thin film, in which metal thin films formed of metals such as platinum (Pt) and iridium (Ir) are deposited at 500° C. to obtain a (111)-oriented metal thin film, and a ferroelectric thin film such as PZT is deposited on this metal thin film at a room temperature, followed by heating of the deposited ferroelectric thin film to a range from 650° C. to 700° C. However, the maximum temperature permitted for a manufacturing process of the FeRAM is usually 620° C.

The ferroelectric material such as PZT having a tetragonal simple perovskite structure has a polarization axis along the c axis <001>. Accordingly, the polarization amount becomes maximum when the ferroelectric layer is approximately oriented along a (001) plane (hereinafter, referred to as (001)-oriented). When the ferroelectric layer is (111)-oriented, a component of the polarization produced in <001> direction is only about $\frac{1}{1.73}$ in <111> direction that is a thickness direction of the ferroelectric layer. Although the polarization can be increased by aligning orientation, it is impossible to increase the polarization to the maximum.

SUMMARY OF THE INVENTION

An object of the present invention is to provide an electronic device capable of obtaining a ferroelectric layer having a large polarization amount and a method of manufacturing the same.

Another object of the present invention is to provide an electronic device provided with a (001)-oriented ferroelectric layer and a method of manufacturing the same.

Still another object of the present invention is to provide an electronic device provided with a ferroelectric capacitor having a $ReO_3$ layer as at least one of electrodes and a method of manufacturing the same.

According to one aspect of the present invention, there is provided an electronic device including: a $ReO_3$ layer having a (001) orientation; and an oxide ferroelectric layer having a perovskite structure, the oxide ferroelectric layer being formed on the $ReO_3$ layer and having a (001) orientation.

According to another aspect of the present invention, there is provided a method of manufacturing an electronic device, including the steps of: preparing a $ReO_3$ layer having a (001) orientation; and forming an oxide ferroelectric layer having a perovskite structure on the $ReO_3$ layer, the oxide ferroelectric layer having a (001) orientation.

A (001)-oriented MgO layer is preferably used as an underlying layer of the $ReO_3$ layer.

Lattice matching can be made for the (001)-oriented $ReO_3$ layer and the (001)-oriented oxide ferroelectric layer having a perovskite structure; accordingly, the (001)-oriented oxide ferroelectric layer having a perovskite structure can be formed on the (001)-oriented $ReO_3$ layer.

The MgO layer can be easily (001)-oriented. The lattice matching can be made for the (001)-oriented MgO layer and the (001)-oriented $ReO_3$ layer. Hence, the (001)-oriented $ReO_3$ layer and the (001)-oriented oxide ferroelectric layer having a perovskite structure can be formed on the (001)-oriented MgO layer sequentially.

The term "ReO$_3$" used herein includes ReO$_3$ to which metal other than Re is added, for example, for controlling a lattice constant thereof.

In such a manner as described above, it is possible to form a ferroelectric capacitor capable of realizing greater polarization.

BRIEF DESCRIPTION OF THE DRAWINGS

FIGS. 2A and 2B are structural views showing chemical formulae of Mg(DPM)$_2$ and i-PrO.

DESCRIPTION OF THE PREFERRED EMBODIMENTS

Hereinafter, description will be made on embodiments of the present invention with reference to the drawings.

Figure 1A:
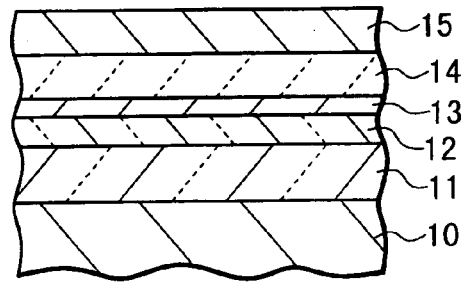
FIG. 1A is a schematic cross-sectional view of an electronic device.

FIG. 1A shows a structure of a ferroelectric capacitor according to a fundamental embodiment of the present invention. A silicon oxide layer 11 is formed on a Si substrate 10. The silicon oxide layer 11 can be formed by thermal oxidation of silicon, chemical vapor deposition (CVD) or the like. The silicon oxide layer 11 may be formed by other methods. The silicon oxide layer 11 has an amorphous phase. A (001)-oriented MgO layer 12 is formed on the silicon oxide layer 11, a (001)-oriented ReO$_3$ layer 13 is formed on the MgO layer 12, and a (001)-oriented PZT layer 14 is formed on the ReO$_3$ layer 13.

The (001)-oriented MgO layer 12, the (001)-oriented ReO$_3$ layer 13 on the MgO layer 12 and the (001)-oriented PZT layer 14 on the ReO$_3$ layer 13, the PZT layer 14 being a ferroelectric layer having a perovskite structure, can be deposited by metalorganic chemical vapor deposition (MOCVD) using a metalorganic (MO) material.

Figure 1B:
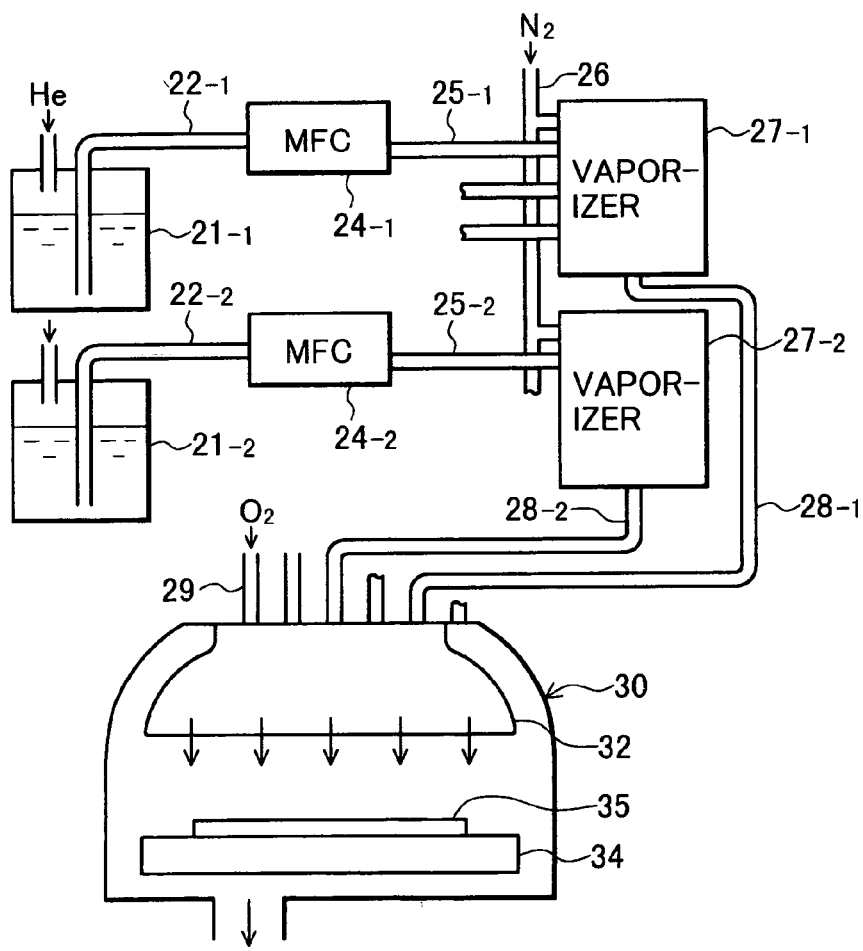
FIG. 1B is a schematic block diagram showing a constitution of a metalorganic chemical vapor deposition (MOCVD) apparatus.

FIG. 1B schematically shows a structure of an apparatus for depositing a film by MOCVD. A liquid container 21-1 contains a metalorganic material solution used for deposition. Pressurized He gas is fed to the liquid container 21-1 from a pipe opened to a space on the solution, thus enabling the solution to be supplied to another pipe 22-1 deeply intruded into the solution. A flow rate of the supplied solution is controlled by a mass flow controller (MFC) 24-1, and the solution is supplied to a vaporizer 27-1 through a pipe 25-1.

A carrier gas pipe 26 is connected to the vaporizer 27-1. The liquid raw material solution supplied to the vaporizer 27-1 together with carrier gas N$_2$ is vaporized by the vaporizer 27-1 and supplied to a pipe 28-1.

A liquid container 21-2, a pipe 22-2, a mass flow controller 24-2, a pipe 25-2, a vaporizer 27-2 and a pipe 28-2 have similar structures as those of the liquid container 21-1, the pipe 22-1, the mass flow controller 24-1, the pipe 25-1, the vaporizer 27-1 and the pipe 28-1, which are described above, respectively. Furthermore, any number of similar raw material supply systems may be provided.

The vaporizer 27-1 may be connected with other liquid raw material supply systems having similar structures as those of the liquid container 21-1, the pipe 22-1, the mass flow controller 24-1 and the pipe 25-1. Other vaporizers can also be provided with any number of the liquid raw material supply systems.

A reaction chamber 30 has raw material pipes such as a gas pipe 29 and the liquid raw material pipes 28-1, 28-2 . . . , and can supply raw material gas from a showerhead 32. A susceptor 34 capable of controlling a temperature thereof is disposed at a lower portion of the reaction chamber 30, and a substrate 35 composed of, for example, a silicon substrate provided with a silicon oxide layer is disposed on the susceptor 34.

In the above description, an example is shown, in which the raw material supply systems are provided in plural; however, a single system may be employed. Moreover, an example of a single reaction chamber is shown; however, a plurality of the reaction chambers may be provided.

With regard to a metalorganic material contained in the liquid containers, for example, as a Mg raw material, a solution obtained by dissolving Mg(DPM)$_2$ (where DPM is dipivaloilmethanate) in the tetrahydrofuran (THF) can be used.

FIG. 2A is a chemical formula showing a chemical structure of Mg(DPM)$_2$. Dipivaloilmethanate (DPM) is bonded at each side of a Mg atom. DPM is monovalent, and n pieces of DPMs can be bonded to an n-valent atom.

As a Re material, a solution obtained by dissolving Re(DPM)$_2$ in THF can be used. A chemical formula of Re(DPM)$_2$ is equivalent to that obtained by replacing Mg with Re in the chemical formula shown in FIG. 2A.

As a Pb material, a solution obtained by dissolving Pb(DPM)$_2$ in THF can be used. A structure of Pb(DPM)$_2$ is equivalent to that obtained by replacing Mg with Pb in the structure shown in FIG. 2A.

As a Zr material, a solution obtained by dissolving Zr(DPM)$_4$ in THF can be used. Zr(DPM)$_4$ has a structure where four DPMs are bonded around one Zr atom.

As a Ti material, a solution obtained by dissolving Ti (i-PrO)$_2$(DPM)$_2$ (where i-PrO is an iso-proxy group) in THF can be used. A structure of Ti (i-PrO)$_2$(DPM)$_2$ is equivalent to that obtained by replacing Mg with Ti in the structure shown in FIG. 2A and by bonding two iso-proxy groups shown in FIG. 2B to Ti. Note that the metalorganic (MO) material is not limited to these examples.

In order to deposit the MgO layer 12 shown in FIG. 1A, pressurized helium (He) gas is fed to the liquid containers 21 containing the solution obtained by dissolving Mg(DPM)$_2$ in THF, and the solution is made to pass through the vaporizers 27 heated at 260° C., vaporized, and loaded on the carrier gas N$_2$.

The Mg raw material, for which N$_2$ is used as carrier gas, is fed through the pipes 28 to the showerhead 32, and supplied to the silicon oxide film on the substrate 35 together with O$_2$ gas supplied from the pipe 29. The silicon oxide film is heated to 560° C., decomposes the supplied metalorganic gas, and combines the decomposed gas with oxygen, thus depositing a (001)-oriented MgO layer. A thickness of the (001)-oriented MgO layer is set, for example, in a range from 50 to 100 nm.

Deposition temperature is not limited to 560° C. Preferably, deposition is carried out with substrate temperature of 620° C. or lower. Accordingly, a step of the deposition can be harmonized with other manufacturing steps for the FeRAM device.

Next, description will be made for the case of depositing the $ReO_3$ layer 13 on the (001)-oriented MgO layer 12. In order to deposit the $ReO_3$ layer 13, the liquid raw material obtained by dissolving $Re(DPM)_2$ in THF, which is contained in the liquid containers 21, is used, and the metalorganic material loaded on the carrier gas is fed to the showerhead 32 in the same manner as the above-described process. To the showerhead 32, $O_2$ gas, mixed gas of $O_2$ gas and $N_2$ gas or the like is simultaneously supplied.

The substrate 35 having the (001)-oriented MgO layer 12 formed thereon is kept at a constant temperature of 560° C. by means of the susceptor 34. The raw material gas is supplied onto the (001)-oriented MgO layer 12 kept at 560° C., whereby the (001)-oriented $ReO_3$ layer 13 is deposited. A thickness of the (001)-oriented $ReO_3$ layer 13 is set, for example, in a range from 20 to 50 nm.

After the (001)-oriented $ReO_3$ layer 13 is deposited, the PZT layer 14 is deposited thereon. For the PZT, as a Pb raw material, the solution obtained by dissolving $Pb(DPM)_2$ in THF is used; as a Zr raw material, the solution obtained by dissolving $Zr(DPM)_4$ in THF is used; and as a Ti raw material, the solution obtained by dissolving $Ti(i-PrO)_2(DPM)_2$ in THF is used. Pressurized helium gas is fed to three liquid containers containing these liquid raw materials, and the liquid raw materials are vaporized by one or three vaporizers and supplied to the showerhead 32.

The substrate temperature is kept at 560° C., and $Pb(DPM)_2$ gas, $Zr(DPM)_4$ gas, $Ti(i-PrO)_2(DPM)_2$ gas and oxygen are simultaneously blown onto the substrate, thus the $Pb(Zr, Ti)O_3$ (PZT) layer 14 is deposited on the (001)-oriented $ReO_3$ layer 13. The deposited PZT layer 14 has also (001) orientation. A thickness of the (001)-oriented PZT layer 14 is set, for example, in a range from 80 to 150 nm.

As described above, an MgO layer is deposited on an amorphous silicon oxide layer 11 by MOCVD, to obtain a (001)-oriented MgO layer 12. On the (001)-oriented MgO layer 12, there can be deposited a $ReO_3$ layer 13, which is (001)-oriented in accordance with the orientation of the underlying layer, that is, the MgO layer 12. Furthermore, on the (001)-oriented $ReO_3$ layer 13, there can be deposited the PZT layer 14, which is (001)-oriented in accordance with the orientation of the underlying layers, that is, the MgO layer 12 and the $ReO_3$ layer 13.

An upper electrode 15 is formed on the PZT layer 14. The upper electrode 15 is not required to be (001)-oriented and can be formed of an electrode material publicly known hitherto. For example, an $IrO_2$ layer is deposited by MOCVD. In this case, as an Ir raw material, a solution obtained by dissolving $Ir(DPM)_3$ in THF is used. Process for vaporizing the material is similar as that described above. The substrate temperature is kept at 560° C., and $Ir(DPM)_3$ gas and oxygen are simultaneously blown thereonto, thus enabling the upper electrode 15 made of $IrO_2$, which is also referred to as an $IrO_2$ layer, to be deposited on the PZT layer 14. A thickness of the $IrO_2$ layer 15 is set, for example, in a range from 100 to 150 nm.

Description has been made for the case of forming the upper electrode 15 of an $IrO_2$ layer; however, various materials can be used for the upper electrode irrespective of the orientation of the ferroelectric layer.

Figure 1C:
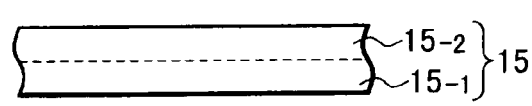
FIG. 1C is a schematic cross-sectional view showing an upper electrode of the electronic device when a stacked structure is adopted therefor.

As shown in FIG. 1C, for the upper electrode, a stacked layer 15 obtained by stacking an $IrO_2$ layer 15-1 and a $SrRuO_3$ layer 15-2 may be used. Deposition methods other than MOCVD may also be used.

For example, the $IrO_2$ layer 15-1 can be deposited by sputtering using an $IrO_2$ target. In this case, the substrate is kept at a room temperature, and the target is sputtered by use of work gas Ar at a vacuum degree of $3\times10^{-4}$ Torr, thus the $IrO_2$ layer 15-1 is deposited. A thickness of the $IrO_2$ layer 15-1 is set, for example, in a range from 100 to 150 nm.

The $SrRuO_3$ layer 15-2 to be deposited on the $IrO_2$ layer 15-1 can also be deposited by sputtering. $SrRuO_3$ is used as a target, the substrate is kept at a room temperature, the vacuum degree is set at $3\times10^{-4}$ Torr, and Ar is used as work gas. Under the above-described conditions, the target is sputtered, and thus the $SrRuO_3$ layer 15-2 is deposited. A thickness of the $SrRuO_3$ layer 15-2 is set, for example, in a range from 10 to 30 nm.

Description has been made above for the case of using PZT as a ferroelectric material; however, other oxide ferroelectric materials having a perovskite structure can be employed. For example, $Pb_yLa_{1-y}Zr_xTi_{1-x}O_3$ (PLZT), $Pb_{1-a-b-c}La_aSr_bCa_cZr_{1-x}Ti_xO_3$ (PLSCZT) and the like can be used.

Moreover, description has been made for the case of using only $O_2$ gas as a kind of gas. However, mixed gas of $O_2$ and other gas, for example, $O_2/N_2$, $O_2/Ar$, $O_2/He$ and $O_2/N_2O$, can also be used.

$ReO_3$ added with a small amount of other metal shows an electrical resistivity of an order of $10^{-6}$ Ω·m at 300° K. A metal layer used as an electrode can be utilized effectively as long as an electrical resistivity thereof is $10^{-5}$ Ω·m or less. Accordingly, $ReO_3$ added with the other metal (metal impurities) can be utilized effectively as such an electrode of the ferroelectric capacitor.

Note that the MgO layer is deposited on the amorphous silicon oxide layer 11, thus forming the (001)-oriented MgO layer 12; however, it will be obvious that a (001) plane of single crystal MgO can be used in place of the deposited MgO layer.

Figure 1D:
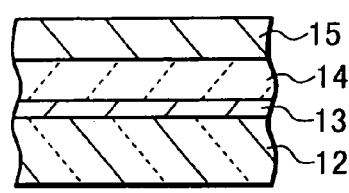
FIG. 1D is a schematic cross-sectional view of the electronic device when a single crystal MgO layer is used therefor, all of which are made for illustrating embodiments of the present invention.

FIG. 1D shows the case where a $ReO_3$ layer 13 and a ferroelectric layer 14 having a perovskite structure are epitaxially grown in this order on a single crystal MgO layer 12 having a (001) plane, and then an upper electrode 15 is formed on the ferroelectric layer 14.

Furthermore, it will be possible to deposit the (001)-oriented MgO layer 12, $ReO_3$ layer 13 and ferroelectric layer 14 by, in place of CVD using the metalorganic (MO) raw materials, CVD using other raw materials. Similarly, it will be possible to deposit the above (001)-oriented layers by sputtering.

The ferroelectric layer 14 is (001)-oriented, thus enabling the polarization caused by application of the voltage to be aligned to a direction perpendicular to the electrode surface. Therefore, it is made possible to utilize the polarization of the ferroelectric layer most effectively.

Figure 3A:
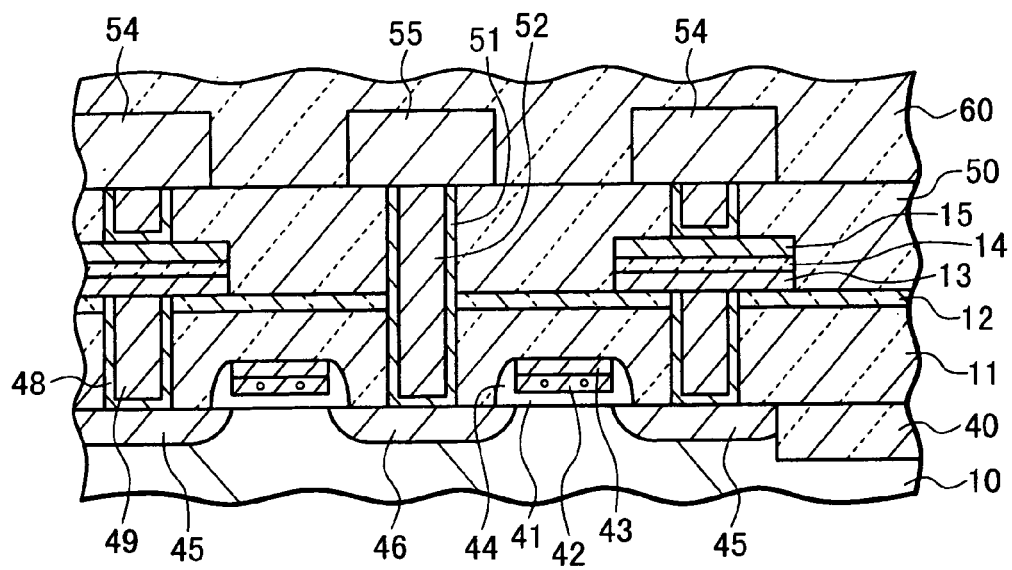
FIGS. 3A and 3B are cross-sectional views of constitutional examples of an electronic device having a ferroelectric capacitor according to embodiments of the present invention.
Figure 3B:
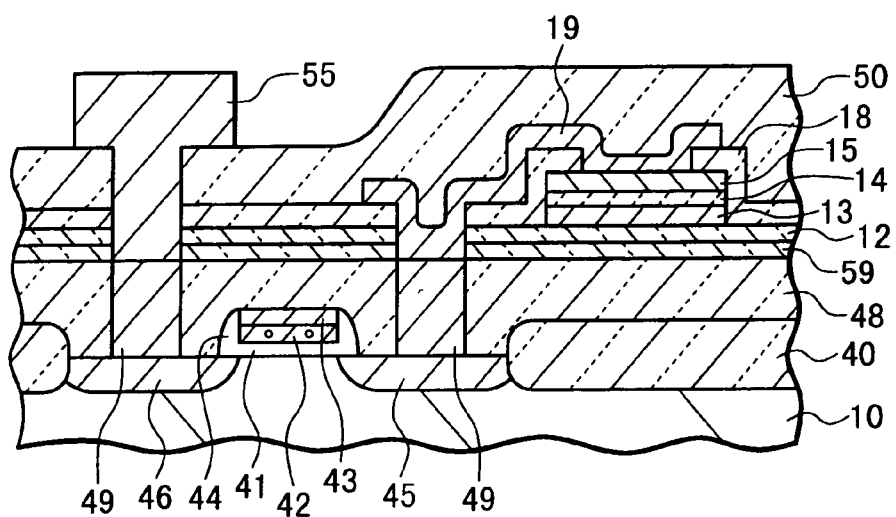

FIGS. 3A and 3B show constitutional examples of electronic devices, each using the ferroelectric capacitor as described above.

FIG. 3A shows an example where electrodes are taken out of upper and lower surfaces of a ferroelectric capacitor. An element isolation region 40 is formed on a surface of a Si substrate 10 by shallow trench isolation (STI). Two MOS transistors are formed in an active region defined by the element isolation region 40. The two MOS transistors have one source/drain region 46 as a common region and other source/drain regions 45 on both sides thereof, which are connected with the ferroelectric capacitors, respectively.

On a channel region between the source/drain regions, is disposed an insulated gate electrode formed of a gate insulating film 41, a polycrystalline gate electrode 42 and a silicide gate electrode 43. A side spacer 44 is formed on a sidewall of the insulated gate electrode. An amorphous insulating layer 11 made of silicon oxide or the like is formed over surfaces where the semiconductor devices are formed. Furthermore, a (001)-oriented MgO layer 12 is formed on a surface of the amorphous insulating layer 11.

In order to form an extraction electrode for each of the both-side source/drain regions 45, a contact hole is formed through the MgO layer 12 and the amorphous insulating layer 11. An extraction plug composed of, for example, barrier metal 48 and a tungsten (W) plug 49 is formed in the contact hole. Then, unnecessary electrode layers on the MgO layer 12 are removed by, for example, chemical mechanical polishing (CMP). Subsequently, on the MgO layer 12, is formed a ferroelectric capacitor composed of the lower $ReO_3$ layer 13, the ferroelectric layer 14 having a perovskite structure 14 and the upper electrode 15.

The MgO layer 12 is (001)-oriented, thus making it possible to form the (001)-oriented lower $ReO_3$ layer 13 and the (001)-oriented ferroelectric layer 14 having a perovskite structure.

After forming the ferroelectric capacitor, an insulating layer 50 made of silicon oxide or the like is deposited to cover a surface thereof. Moreover, a contact hole is formed through the insulating layer 50, and then a barrier metal layer 51 and a metal conductive layer 52 made of W or the like are buried in the contact hole, thus the extraction electrode is formed. After forming the extraction electrode, unnecessary electrode layers on the insulating layer 50 are removed, and upper wirings 54 and 55 are formed. Surfaces of the upper wirings 54 and 55 are covered with an insulating layer 60.

FIG. 3B shows a constitution, in which two electrodes are taken out of the upper surface of the ferroelectric capacitor. An element isolation region 40 of silicon oxide formed by local oxidation of silicon (LOCOS) is formed on the surface of the Si substrate 10. One MOS transistor is formed in an active region defined by the element isolation region 40.

On a channel region, is disposed an insulated gate electrode formed of a gate insulating film 41, a polycrystalline gate electrode 42 and a polycrystalline silicide gate electrode 43. A side spacer 44 is formed on a sidewall of the insulated gate electrode. Source/drain regions 45 and 46 are formed on both sides of the gate electrode by ion implantation and the like.

An amorphous insulating layer 48 made of silicon oxide or the like is formed to cover the MOS transistor. Plugs 49 for deriving the source/drain regions 45 and 46 are formed. A silicon nitride layer 59, for example, having an amorphous phase is formed on a surface of the amorphous insulating layer 48 through which the plugs 49 are formed, thus an oxygen shielding layer is formed.

On the amorphous silicon nitride layer 59, a (001)-oriented MgO layer 12 is formed. It is conceivable that the (001)-oriented MgO layer 12 can be deposited as long as its underlying layer is amorphous. On the (001)-oriented MgO layer 12, is formed a ferroelectric capacitor composed of a (001)-oriented $ReO_3$ layer 13, a (001)-oriented ferroelectric layer 14 having a perovskite structure and an upper electrode 15. The lower $ReO_3$ electrode 13 is extracted along a direction perpendicular to the drawing sheet. An insulating layer 18 made of silicon oxide or the like is formed to cover the ferroelectric capacitor.

Desired portions of the insulating layer 18, MgO layer 12 and silicon nitride layer 59 are removed by etching, to form contact holes. Then, a local wiring 19 connects the plug 49 exposed in the contact hole with the upper electrode 15. An insulating layer 50 is further formed to cover the local wiring 19. Through the insulating layer 50, an opening for exposing the plug 49 on the other source/drain region 46 is formed. The other wiring 55 is formed, filling the opening.

The above-described constitutions around the ferroelectric capacitor and around the transistor, which are shown in FIGS. 3A and 3B, respectively, are examples, and have no limitative meaning. Various alternations and exchanges may be employed. Multi-layered wiring structure can be formed by other publicly known techniques. As described above, the electronic device with the ferroelectric capacitor, for example, a semiconductor integrated circuit device can be manufactured.

Although the present invention has been described along the embodiments, the present invention is not limited thereto. It will be obvious to those skilled in the art that various modifications, improvements and combinations can be made.

We claim:

1. A method of manufacturing an electronic device, comprising the steps of:
   (a-1) forming a MgO layer having a (001) orientation, on an amorphous layer,
   (a-2) forming a $ReO_3$ layer having a (001) orientation, on said MgO layer; and
   (b) forming an oxide ferroelectric layer having a perovskite structure and a (001) orientation, on said $ReO_3$ layer.

2. The method of manufacturing an electronic device according to claim 1, wherein at least one of said steps (a-1), (a-2) and (b) is done by metalorganic chemical vapor deposition (MOCVD).

3. The method of manufacturing an electronic device according to claim 2, wherein all of said steps (a-1), (a-2) and (b) are done by MOCVD.

4. The method of manufacturing an electronic device according to claim 2, wherein said MOCVD is executed at a substrate temperature of 620° C. or lower.

5. The method of manufacturing an electronic device according to claim 2, wherein said MOCVD uses, as organometal raw material, a dipivaloilmethanate (DPM) compound of metal or an iso-proxy (i-PrO) compound of metal.

6. The method of manufacturing an electronic device according to claim 1, wherein at least one of said steps (a-1), (a-2) and (b) is done by sputtering.

7. The method of manufacturing an electronic device according to claim 1, further comprising the step of: (c) forming at least one upper electrode layer on said oxide ferroelectric layer.

* * * * *